(12) United States Patent
Oshima

(10) Patent No.: US 7,444,576 B2
(45) Date of Patent: Oct. 28, 2008

(54) TARGET VALUE SEARCH CIRCUIT, TAGET VALUE SEARCH METHOD, AND SEMICONDUCTOR TEST DEVICE USING THE SAME

(75) Inventor: Hideyuki Oshima, Tokyo (JP)

(73) Assignee: Advantest Corp., Tokyo (JP)

( * ) Notice: Subject to any disclaimer, the term of this patent is extended or adjusted under 35 U.S.C. 154(b) by 554 days.

(21) Appl. No.: 10/532,367

(22) PCT Filed: Oct. 24, 2003

(86) PCT No.: PCT/JP03/13630

§ 371 (c)(1),
(2), (4) Date: Apr. 20, 2005

(87) PCT Pub. No.: WO2004/038436

PCT Pub. Date: May 6, 2004

(65) Prior Publication Data
US 2006/0020577 A1    Jan. 26, 2006

(30) Foreign Application Priority Data
Oct. 24, 2002    (JP)    ............... 2002-310146

(51) Int. Cl.
*G01R 31/28*    (2006.01)
(52) U.S. Cl. ............... 714/744; 707/3; 707/201; 365/185.03

(58) Field of Classification Search ............... None
See application file for complete search history.

(56) References Cited
U.S. PATENT DOCUMENTS

| 6,643,787 | B1 * | 11/2003 | Zerbe et al. ............... 713/400 |
| 6,911,853 | B2 * | 6/2005 | Kizer et al. ............... 327/158 |
| 7,191,373 | B2 * | 3/2007 | Wang et al. ............... 714/729 |
| 2002/0049753 | A1 * | 4/2002 | Burrows ............... 707/3 |
| 2002/0138801 | A1 * | 9/2002 | Wang et al. ............... 714/729 |

FOREIGN PATENT DOCUMENTS

| JP | 02-143954 | 6/1990 |
| JP | 2000-131390 | 5/2000 |
| JP | 2002-040091 | 2/2002 |

* cited by examiner

*Primary Examiner*—Jacques H Louis-Jacques
*Assistant Examiner*—Steven D Radosevich
(74) *Attorney, Agent, or Firm*—Muramatsu & Associates

(57) ABSTRACT

In a tentative target value calculation section 28, a predetermined value is subtracted from (or added to) a target value Exp to calculate a tentative target value ExpB. In a binary search executing section 25, binary search is executed, and a searching region is limited to a certain region including this tentative target value ExpB. Next, in a sequential search executing section 29, the target value Exp is searched for in an increasing direction from the tentative target value ExpB which is a start point in the limited searching region. Accordingly, both drop prevention of measurement precision and reduction of searching time are achieved consistently, and a target value is securely and normally found in a case where a sequence constituting a searching object indicates an ascending-order sequence including a decrease in a part.

4 Claims, 10 Drawing Sheets

TARGET VALUE SEARCH CIRCUIT, TAGET VALUE SEARCH METHOD, AND SEMICONDUCTOR TEST DEVICE USING THE SAME

TECHNICAL FIELD

The present invention relates to a search circuit which searches for a target value in a sequence including a decrease of a value in a part and having an ascending order, a searching method, and a semiconductor test apparatus, particularly to a search circuit preferable for a semiconductor test apparatus comprising a timing variable delay circuit, a searching method, and a semiconductor test apparatus using this method.

BACKGROUND ART

A semiconductor test apparatus has heretofore been known as an apparatus which conducts a test with respect to various semiconductor devices such as a logic IC and a semiconductor memory.

Examples of the tests conducted by this semiconductor test apparatus include a function test, a direct-current characteristic test (DC parameter test), an alternating-current characteristic test (AC parameter test) and the like.

Among these tests, the function test is a test conducted for guaranteeing the function of the semiconductor device. For example, as shown in FIG. 5, a test pattern signal from a test pattern generator 11 is supplied to an IC to be tested (hereinafter referred to as a device under test "DUT") 12, and an output signal is compared with an expected value pattern by a comparator 13 to judge whether or not various functions of the DUT 12 are satisfactory.

More specifically, the function test of the DUT 12 is performed by a semiconductor test circuit 10 constituted as shown in FIG. 6.

In the figure, test pattern data with respect to one DUT (semiconductor device) 12 having a plurality of pins is stored in a memory (expected value memory) 14 together with expected value data S to be sent to the comparator 13.

A test pattern signal applied to the DUT 12 by the test pattern generator 11 based on the test pattern data of the memory 14 is generated in synchronization with a reference clock signal CLK of a reference clock generator 15, and is supplied to an input terminal i of the DUT 12 through a DUT input delay circuit (timing generator) 16 having variable delay circuits DL1, SK1.

Moreover, a reference clock signal of the reference clock generator 15 is also supplied as a strobe signal STRB to a clock terminal of a D-type flop-flop circuit (hereinafter referred to as "DF/F") 13-1 of the comparator 13 through a comparison timing delay circuit 17 having variable delay circuits DL2, SK2.

A delay amount Tpd is set to the variable delay circuits DL1, SK1, DL2, SK2 by a program control of a control unit 18.

Among them, the variable delay circuits DL1, DL2 are delay circuits capable of defining a time phase with respect to the DUT 12 by a user program.

On the other hand, the variable delay circuits SK1, SK2 correct the phase with respect to the DUT 12 into a predetermined value, that is, calibrate hardware, because the delay amount Tpd of the hardware including the above-described DL1, DL2 and the like fluctuates with an ambient temperature change or elapse of time.

An output (response output signal) of the DUT 12 is input into the DF/F 13-1 of the comparator 13, and an output is input into an agreement circuit (exclusive-OR circuit; Ex-OR) 13-2. Here, the output is compared with the expected value data S="1" from the memory 14, and a comparison result is input into a DF/F 13-3.

When an output (C point) of the DF/F 13-1 is "L" (or "H") in this comparator 13, the output disagrees (or agrees) with the expected value data S="1", therefore an output (E point) of the disagreement circuit 13-2 turns to "H" (or "L"), an output (F point) of the DF/F 13-3 turns to "H" (or "L"), and a result of comparison in this comparator 13 is Fail (or Pass).

By the way, when the function test of the DUT 12 is performed, test pattern signals input into a plurality of, several tens to several hundreds of pins in the DUT 12 are preferably synchronized, respectively.

However, a phase delay time, that is, a difference of timing is generated from a difference of each path in each test pattern signal.

The difference of the path, which causes generation of the phase delay time is made by a difference of a physical condition, a change of the path in a waveform shaping unit (portion for forming an output signal from the test pattern generator 11 in accordance with a circuit constitution of the DUT 12, not shown), thermal influence on a semiconductor device for use in each path and the like.

Therefore, an error is made in the comparison result in the comparator 13 by a shift of synchronization of each test pattern signal, and correct function test has not been performed.

To solve the problem, in a case where the function test is performed using the semiconductor test apparatus 10, the test pattern signals are adjusted to be synchronized for each test pattern signal at an initializing time.

In general, a frequency measurement unit or the like is used in measuring the delay amount Tpd of the test pattern signal in order to synchronize each test pattern signal.

It is to be noted that the measurement of the delay amount Tpd of the test pattern signal is not limited to the use of the frequency, and, for example, a reflected wave or the like is usable.

A method is performed as follows in which the delay amount Tpd of the test pattern signal is measured using the frequency measurement unit, and a delay amount set value of the variable delay circuit DL1 is applied in such a manner as to bring the delay amount Tpd close to the target value.

It is to be noted that a variable range of the variable delay circuit DL1 is set to $\tau(1 \text{ to } n)=0$ ns to 20 ns, and it is assumed that a first delay amount set value in the DUT input delay circuit 16 is set to an intermediate value $\tau1=10$ ns of the variable range $\tau(1 \text{ to } n)$ of the variable delay circuit DL1. It is also assumed that the target value is set to 100 nanoseconds (ns).

Moreover, transition of the delay amount set value of the variable delay circuit DL1 is shown in FIG. 7.

First, in the frequency measurement unit, the delay amount of the test pattern signal is measured by a loop frequency.

It is assumed that the delay amount measured value is 104 ns in first measurement ($\tau1=10$ ns).

Next, the delay amount measured value (104 ns) is compared/judged with the target value (100 ns). As a result of judgment, since the delay amount measured value exceeds the target value, the delay amount set value of the variable delay circuit DL1 in the DUT input delay circuit 16 is calculated like $\tau2=\tau1-(\tau1/2^1)=5$ ns.

Moreover, the delay amount Tpd of the variable delay circuit DL1 is set in such a manner as to indicate the calculated delay amount set value.

Next, it is assumed that the delay amount measured value is 99 ns in second measurement.

In this case, since the delay amount measured value is below the target value, the delay amount set value is calculated like $\tau3=\tau2+(\tau1/2^2)=7.5$ ns.

Moreover, the calculated delay amount set value is set as the delay amount Tpd of the variable delay circuit DL1.

It is assumed that the delay amount measured value is 101.5 ns in third measurement.

In this case, since the delay amount measured value exceeds the target value, the delay amount set value is calculated like $\tau4=\tau3-(\tau1/2^3)=6.25$ ns, and is set as the delay amount Tpd of the variable delay circuit DL1.

It is assumed that the delay amount measured value is 100.25 ns in fourth measurement.

In this case, since the delay amount measured value exceeds the target value, the delay amount set value is calculated like $\tau5=\tau4-(\tau1/2^4)=5.625$ ns, and is set as the delay amount Tpd of the variable delay circuit DL1.

Subsequently, it is similarly assumed that the delay amount measured value is 99.625 ns in fifth measurement. Then, in this case, since the delay amount measured value is below the target value, the delay amount set value is calculated like $\tau6=\tau5-(\tau1/2^5)=5.9375$ ns, and is set as the delay amount Tpd of the variable delay circuit DL1.

Moreover, it is assumed that the delay amount measured value is 99.9375 ns in sixth measurement. Then, also in this case, since the delay amount measured value is below the target value, the delay amount set value is calculated like $\tau7=\tau6-(\tau1/2^6)=6.09375$ ns, and is set as the delay amount Tpd of the variable delay circuit DL1.

Thus, in i-th measurement, the delay amount Tpd of the variable delay circuit DL1 is decreased or increased in a binary form by $\tau1/2^{(i-1)}$ ns depending on whether the delay amount measured value is above or below the target value in i−1-th measurement, and the delay amount measured value is brought close to the target value.

The measuring while driving the delay amount measured value into the target value in the binary form in this manner is referred to as binary search.

According to this method, the frequency measurement unit applies the delay amount Tpd of the variable delay circuit DL1 for each path through which each test pattern signal passes in such a manner as to synchronize all input timings of the respective test pattern signals input into the plurality of pins of the DUT 12. Therefore, initial adjustment at the initializing time is possible in the function test of the DUT 12 performed using the semiconductor test apparatus 10.

However, in the variable delay circuit DL1 of the DUT input delay circuit 16, the delay amount Tpd fluctuates, for example, by a change of ambient temperature of IC or power voltage applied to the IC, manufacturing fluctuation of the IC, fluctuation of self heating amount and the like. By this fluctuation, as shown in FIG. 8, discontinuity is generated for each 1CLK frequency divider.

Moreover, in other words, the delay amount Tpd including the discontinuities is a sequence including a decrease in a part and having an ascending order. Therefore, it cannot be said that it is necessarily appropriate to search for the target value only by the binary search assuming a pure ascending-order sequence as a search target (i.e., the use of the only binary search as the method of measuring the delay amount Tpd of the test pattern signal).

In this case, it is considered that a portion which cannot be searched for by the binary search is compensated by sequential search.

A value agreeing with the target value is checked in order from an end of an array in the sequential search. Therefore, when elements of the array increase, much time is required for the searching, but the array does not have to be arrayed in an ascending or descending order.

On the other hand, in the binary search, a medium value (median) of the array is compared with a value (target value) to be searched for. In a case where the respective values are not equal to each other, a first half (or a latter half) of the array is removed, and the medium value of a remaining latter half (or first half) part is compared with the target value. The comparison of the respective values and halving of the array are repeatedly performed until the medium value agrees with the target value. Therefore, although a searching time can be shortened in the binary search, it is a condition that the array be arrayed in the ascending or descending order.

Moreover, since the delay amount Tpd of the test pattern signal in the conventional semiconductor test apparatus has a waveform (serrated waveform) of the ascending-order array including the decrease in a part, the searching range is limited as much as possible by the binary search, the target value is searched for by the sequential search in this limited searching range, and accordingly it is possible to shorten the searching time without dropping measurement precision.

That is, it is possible to realize both the reduction of the searching time by the binary search and the prevention of the drop of the measurement precision by the sequential search.

Specifically, for example, as shown in FIG. 9, when the vicinity of a middle of the delay amount Tpd having the same continuous tilt or a larger portion (e.g., A point, etc., when there is not any discontinuity within a lower half range in a searching range of the sequential search centering on a binary search result) is searched, the target value can be normally searched in the searching range by the sequential search, because any discontinuity does not exist in the searching range.

However, even when the binary search and the sequential search are used together, the target value cannot be normally searched for in some case.

For example, in a case where the binary search result is in the vicinity of the discontinuity of the delay amount Tpd (the vicinity of a valley of the serrated waveform, e.g., point B, etc. in the figure), the sequential search in an increasing direction is possible. However, when the sequential search is performed in a decreasing direction, a value larger than the target value is again searched for at a time approaching the discontinuity. Therefore, the search in the searching range ends until the target value is found, and there has been a problem that the target value cannot be normally searched for.

Especially, in a case where the target value of the test pattern signal is searched for by a combination of the binary search and the sequential search in the conventional semiconductor test apparatus, as shown in FIG. 10, a slight difference is sometimes made between a VD delay characteristic of the binary search and that of the sequential search.

This difference has been made by an influence of hysteresis of the binary search.

The influence of hysteresis mentioned herein is an influence of a previously set edge on a presently set edge, and indicates that a VD delay error appears when an influence amount changes based on a size of time difference between the previous and present edges.

It is to be noted that FIG. 10 shows the difference for ease of description. An actual difference appears at random. The difference is random because the position of the edge of the previous cycle changes every search in the binary search.

As shown in the figure, a delay amount Tpdb indicating a target value Exp agrees with B1 and B2 points in a graph showing the VD delay characteristic of the binary search. However, the delay amount Tpdb agrees only with B3 point in a graph showing the VD delay characteristic of the sequential search. Moreover, the B3 point is not included in the searching range of the sequential search centering on the B1 point.

From this, when the binary search is executed to fine the B1 point, B3 cannot be found even if the sequential search is executed, and there has been a problem that the searching cannot be normally performed.

The present invention has been developed to solve the above-described problem, and an object thereof is to provide a search circuit of a target value, in which normal and secure search for a target value Exp (delay amount Tpdb) is possible even in a sequence including a decrease of the value in a part and having an ascending order (e.g., characteristic of a delay amount Tpd with respect to a set value of a timing VD) and in which further the use of both binary search and sequential search is possible and which realizes both reduction of a searching time and prevention of drop of measurement precision, a method of searching for a target value, and a semiconductor test apparatus using this method.

DISCLOSURE OF THE INVENTION

To achieve this object, according to the present invention, there is provided a search circuit for a target value, comprising: a target value storage section which stores a target value; a search control section which extracts the target value from the target value storage section and which sets, as a tentative target value, a value obtained by subtracting a predetermined value from the extracted target value or adding the predetermined value thereto; a binary search executing section which limits a searching range to a certain region including the tentative target value by binary search; and a sequential search executing section which searches for the target value in an increasing or decreasing direction from the tentative target value which is a start point in the limited searching range by sequential search.

By this constitution of the search circuit for the target value, the target value can be normally and securely searched for, even in a case where a sequence which is a searching object is a sequence including a decrease in a part and having an ascending order, and a micro difference is made between a binary search characteristic and a sequential search characteristic.

In a conventional search circuit, in a case where a valley of a serrated waveform is included in a range indicating values smaller than the target value in the searching range limited by the binary search, and the micro difference is made between the binary search characteristic and the sequential search characteristic, the target value is not included in the searching range of the sequential search, and the target value cannot be normally searched for in some case.

On the other hand, in the search circuit of the present invention, the predetermined value (e.g., a value indicating a half region of the searching region of the sequential search) is subtracted from the target value or added to the target value to obtain the tentative target value, the tentative target value is searched for by the binary search, further the tentative target value obtained by this search is regarded as a search start value (start point), and the sequential search is executed in the increasing direction.

Consequently, a situation is avoided in which the target value deviates from the searching range because there is discontinuity and there is a difference between the binary search characteristic and the sequential search characteristic. The target value can be searched for.

Therefore, the target value can be normally and securely searched for even in a case where the sequence constituting the searching object is a sequence including the decrease in a part and having the ascending order, or a micro difference is made in the binary search characteristic and the sequential search characteristic.

Furthermore, since the target value is searched for by combination of the binary search and the sequential search, both prevention of drop of measurement precision and reduction of searching time can be realized consistently.

It is to be noted that in the present invention "searching range" is a range searched by the sequential search, and indicates a searching range on an adjustment side, for example, a searching range in Timing-VD set value shown in FIG. 10.

Furthermore, "searching region" is a region searched by the sequential search, and indicates a searching region on a side to be adjusted, for example, a searching region in delay amount Tpd shown in FIG. 10.

Moreover, according to the present invention, there is provided a method of searching for a target value, comprising: a step of storing a target value; a step of extracting the target value, and setting, as a tentative target value, a value obtained by subtracting a predetermined value from the extracted target value or adding the predetermined value thereto; a step of limiting a searching range to a certain region including the tentative target value by binary search; and a step of searching for the target value in an increasing or decreasing direction from the tentative target value which is a start point in the limited searching range by sequential search.

In this method of searching for the target value, the certain region including the tentative target value is searched for by the binary search, further the target value is searched for in the increasing direction from the tentative target value which is the start point in the certain region by the sequential search, and therefore measurement precision is enhanced, while searching time can be reduced.

Moreover, even in a case where a sequence which is a searching object indicates a serrated waveform, and a binary search characteristic is different from a sequential search characteristic, a disadvantage that the target value does not exist in the searching range of the sequential search does not occur, and therefore the target value can be securely searched for.

Moreover, a semiconductor test apparatus of the present invention is a semiconductor test apparatus comprising: a reference clock generation unit which generates a reference clock signal; a test pattern generation unit which outputs a test pattern signal applied to a semiconductor device in synchronization with the reference clock signal; a timing generation unit comprising a variable delay circuit which delays the test pattern signal by a predetermined time; and a comparison unit which compares a response output signal output from the semiconductor device with an expected value pattern, the semiconductor test apparatus further comprising: a search circuit comprising: a storage section which stores a target value; a delay amount measurement section which obtains a delay amount measured value of the test pattern signal; a tentative target value calculation section which extracts the target value from the target value storage section and which calculates, as a tentative target value, a value obtained by subtracting a predetermined value from the extracted target value or adding the predetermined value thereto; a binary search executing section which applies a delay amount set value of a variable delay circuit in such a manner as to limit a searching range to a certain region including the tentative target value by binary search; a sequential search executing section which applies the delay amount set value of the variable delay circuit in such a manner as to search for the target value in an increasing or decreasing direction from the tentative target value which is a start point in the limited searching range by sequential search; a VD setting section which sets a delay amount of the variable delay circuit; and a search control section which sends the tentative target value and the delay amount measured value to the binary search executing section and which sends the delay amount set value from the binary search executing section to the VD setting section to set the delay amount of the variable delay circuit and which sends the delay amount set value, the target value, and the delay amount measured value, obtained by limiting, to the sequential search executing section, when the searching range is limited to the certain region including the tentative target value and which sends the delay amount set value from the sequential search executing section to the VD setting section to set the delay amount of the variable delay circuit.

By this constitution of the semiconductor test apparatus, since the target value is searched for by combination of the binary search and the sequential search, both enhancement of measurement precision and reduction of searching time can be realized consistently.

Furthermore, even in a case where a delay amount Tpd which is a searching object indicates a serrated waveform, and a difference is made between a binary search characteristic and a sequential search characteristic, the predetermined value (e.g., value indicating a half region in the searching region of the sequential search) is subtracted from (or added to) the target value to obtain the tentative target value, and the sequential search is executed from the tentative target value which is a start point. Therefore, the target value can be included in the searching region, and the target value can be securely and normally searched for.

Moreover, in the semiconductor test apparatus of the present invention, the tentative target value calculation section is constituted to subtract or add a value indicating the region of the half of the searching region of the sequential search, which is the predetermined value, with respect to the target value, and calculate the subtracted or added value as the tentative target value.

By this constitution of the semiconductor test apparatus, even in a case where the delay amount Tpd constituting the searching object indicates a characteristic of an ascending order including a decrease in a part, and a difference is made between the binary search characteristic and the sequential search characteristic, the target value can be securely searched for by the sequential search because the target value can be included in the searching range of the sequential search.

BEST MODE FOR CARRYING OUT THE INVENTION

Embodiments of the present invention will be described hereinafter with reference to the drawings.

First, the embodiments of a search circuit for a target value, a method of searching for the target value, and a semiconductor test apparatus using this method according to the present invention will be described with reference to FIG. 1.

The figure is a block diagram showing a constitution of the search circuit of the present embodiment.

Figure 2:
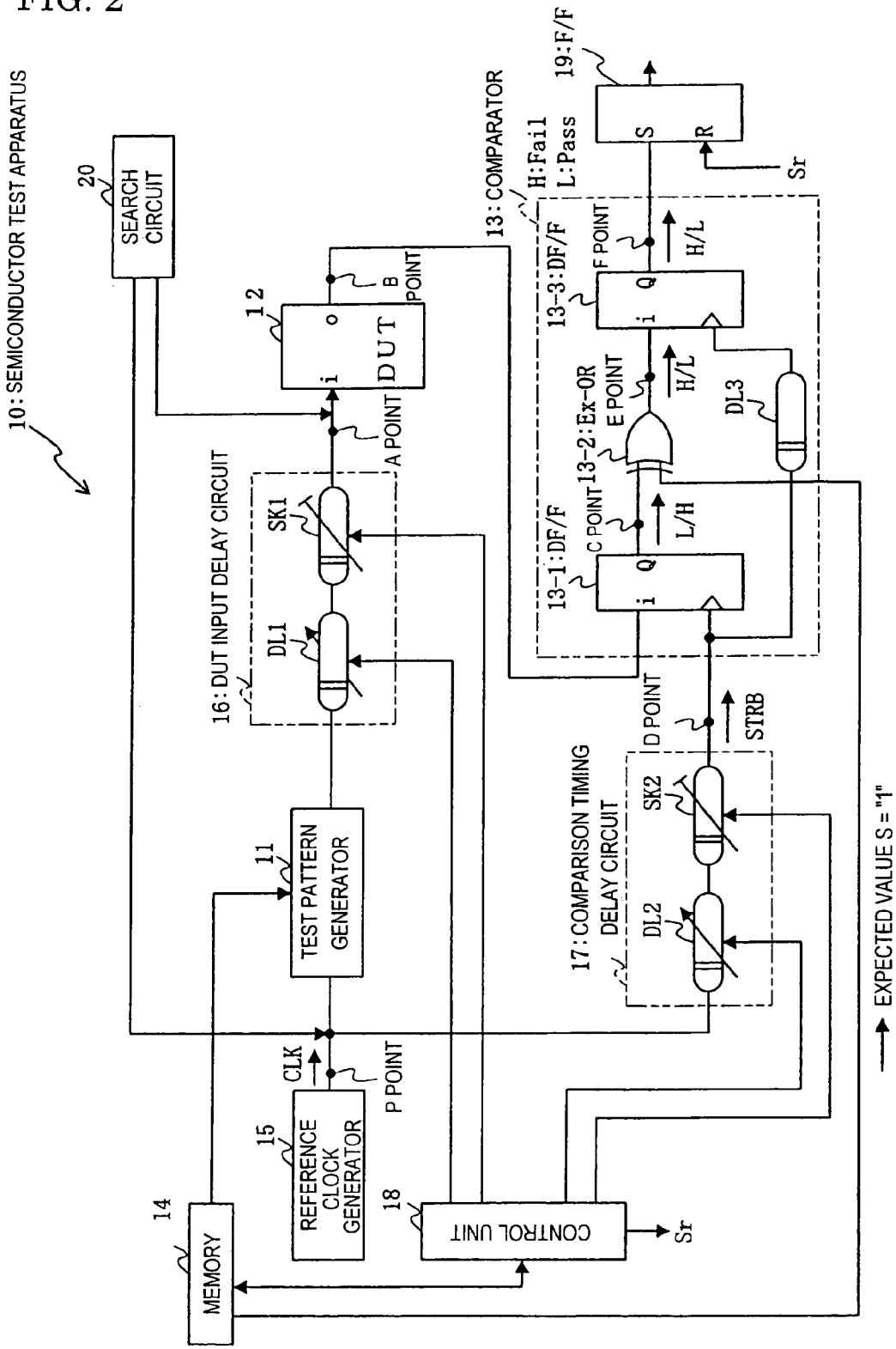
FIG. 2 is a block diagram showing a constitution of a semiconductor test apparatus connected to the search circuit of FIG. 1.

The search circuit of the present embodiment is usable as a search circuit 20 of a semiconductor test apparatus 10 shown in FIG. 2.

Figure 1:
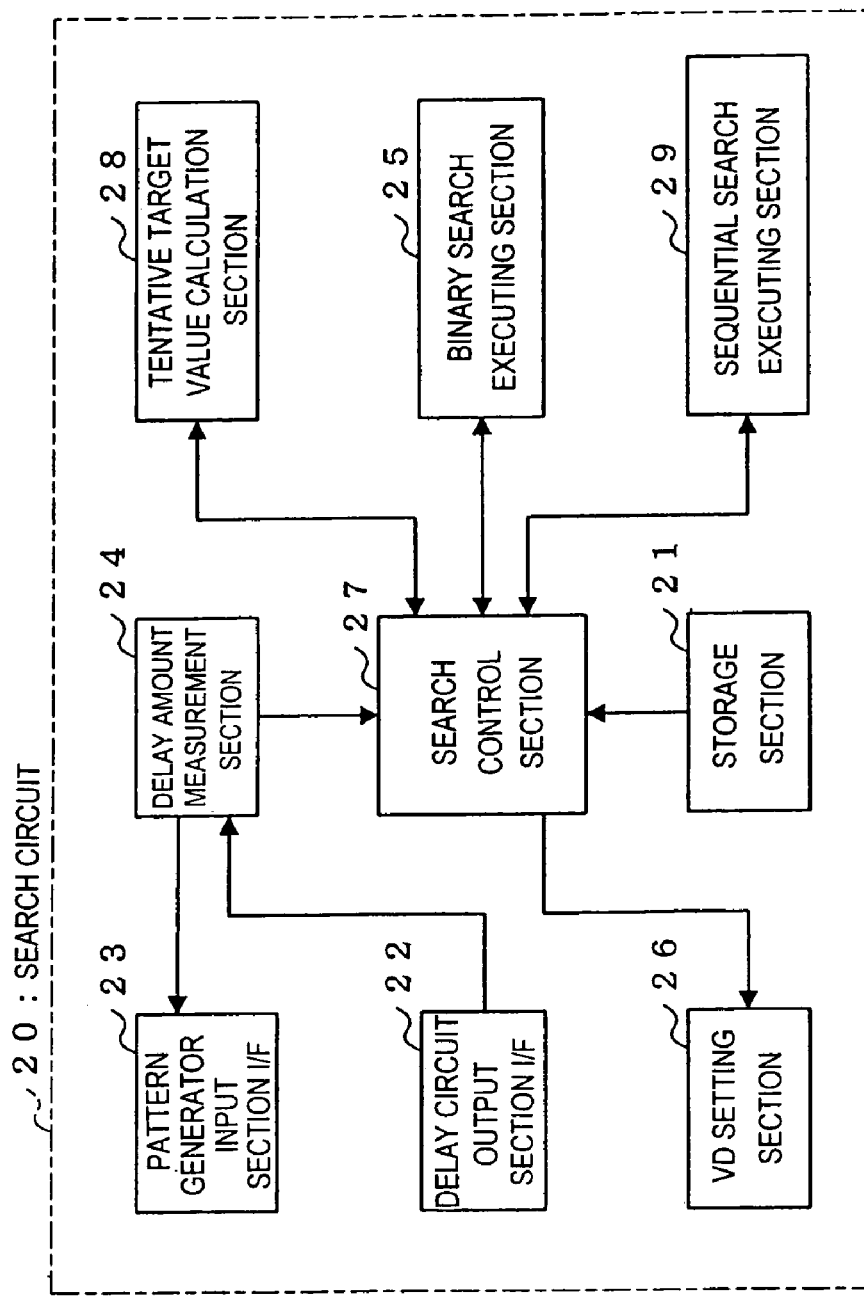
FIG. 1 is a block diagram showing a constitution of a search circuit of the present invention.

As shown in FIG. 1, the search circuit 20 has a storage section 21, a delay circuit output section I/F 22, a test pattern generator input section I/F 23, a delay amount measurement section 24, a binary search executing section 25, a VD setting section 26, a search control section 27, a tentative target value calculation section 28, and a sequential search executing section 29.

The storage section (target value storage section) 21 stores a target value Exp, a tentative target value ExpB, and a searching range b (or searching region b) of sequential search.

The delay circuit output section I/F 22 is connected to an output side of a DUT input delay circuit 16, and sends a test pattern signal (delay clock signal) input from the DUT input delay circuit 16 to the delay amount measurement section 24.

The test pattern generator input section I/F 23 is connected to an input side of the test pattern generator 11. Accordingly, a path passing through a test pattern generator 11 and the DUT input delay circuit 16 is connected to a path passing through the delay circuit output section I/F 22, delay amount measurement section 24, and test pattern generator input section I/F 23 via a loop.

The delay amount measurement section 24 measures a delay amount Tpd of the test pattern signal based on the test pattern signal (delay clock signal) from the delay circuit output section I/F 22. Moreover, the section sends a delay amount measured value which is a measurement result to the search control section 27.

It is to be noted that the measurement of the delay amount Tpd of the test pattern signal is not limited to the use of loop frequency, and, for example, a reflected wave or the like is usable.

The binary search executing section 25 receives the tentative target value ExpB and the delay amount measured value from the search control section 27. Moreover, the section executes binary search based on an execution instruction from the search control section 27.

The binary search executed by this binary search executing section 25 is performed in such a manner as to change all set values of a variable delay circuit DL1 every bit from most significant bit/byte (MSB) to least significant bit/byte (LSB) by size comparison with the tentative target value ExpB while reducing a searching region by half. This process is repeated to thereby search for the tentative target value ExpB.

Additionally, here, the present invention will be described assuming that the set value of the variable delay circuit DL1 is binary digit representation.

Moreover, the binary search executing section 25 calculates "set value (delay amount set value, VD set value) of the variable delay circuit DL1=immediately previous VD set value−object bit" as a search result, when the tentative target value ExpB is smaller than a delay amount measured value Tpd. On the other hand, when the tentative target value ExpB is larger than the delay amount measured value Tpd, "VD set value=immediately previous VD set value" is calculated as the search result.

That is, in the binary search executing section 25, "immediately previous VD set value−object bit+bit obtained by shifting object bit by one bit on an LSB side" and "immediately previous VD set value+object bit+bit obtained by shifting object bit by one bit on the LSB side" are repeated, and the searching is performed to the LSB to obtain a result as a search result.

Furthermore, the binary search executing section 25 sends the delay amount set value which is the search result to the search control section 27.

Moreover, when the searching range b is limited to a certain region including the tentative target value ExpB, and the searching is ended, the binary search executing section 25 a search end signal indicating that the searching has been ended to the search control section 27.

The VD setting section 26 sets an initial value (medium value of a VD variable range τ(1 to n)) of the delay amount Tpd with respect to the variable delay circuit DL1 of the DUT input delay circuit 16.

Furthermore, when the delay amount set value is sent from the search control section 27, the VD setting section 26 sets the variable delay circuit DL1 in such a manner as to be adapted to the delay amount set value.

The search control section 27 extracts the target value Exp and the searching range b (of the sequential search) from the storage section 21, and sends these target value Exp and searching range b to the tentative target value calculation section 28. Moreover, the tentative target value ExpB from the tentative target value calculation section 28 is sent to storage section 21, and stored.

Furthermore, the search control section 27 sends the tentative target value ExpB extracted from the storage section 21, and the delay amount measured value received from the delay amount measurement section 24 to the binary search executing section 25, and instructs (execution instruction) the section to execute the binary search, so that the delay amount set value of the variable delay circuit DL1 is calculated. Moreover, the delay amount set value from the binary search executing section 25 is sent to the VD setting section 26.

Thereafter, when the search end signal is sent from the binary search executing section 25, the search control section 27 subsequently extracts the target value Exp and the tentative target value ExpB from the storage section 21. Moreover, the search control section sends these target value Exp and tentative target value ExpB, the delay amount set value finally obtained by the binary search executing section 25, and the delay amount measured value from the delay amount measurement section 24 to the sequential search executing section 29, and instructs (execution instruction) the section to execute the sequential search, so that the delay amount set value of the variable delay circuit DL1 is calculated. Furthermore, the delay amount set value from the sequential search executing section 29 is sent to the VD setting section 26.

On receiving the target value Exp and the searching range b (of the sequential search) from the search control section 27, the tentative target value calculation section 28 subtracts or adds a value of half of a value indicating the searching range b with respect to the target value Exp to calculate the tentative target value ExpB.

Moreover, the tentative target value calculation section 28 sends the calculated tentative target value ExpB to the search control section 27.

It is to be noted that not the tentative target value calculation section 28, but the search control section 27 may be provided with a function of the tentative target value calculation section 28, that is, a function of subtracting or adding the value of the half of the value indicating the searching range b of the sequential search with respect to the target value Exp to calculate the tentative target value ExpB.

The sequential search executing section 29 executes the sequential search based on the execution instruction from the search control section 27.

In the sequential search executed by the sequential search executing section 29, all delay amount set values settable to the variable delay circuit DL1 are measured in order, and a set value close to the target value Exp is searched for.

When the binary search in the binary search executing section 25 is used together with the sequential search in the sequential search executing section 29, enhancement of measurement precision, or reduction of searching time can be achieved in searching for the target value Exp in the semiconductor test circuit 10.

However, when the measurement precision of the binary search is deteriorated by influence of hysteresis, the following problem sometimes occurs.

Figure 3:
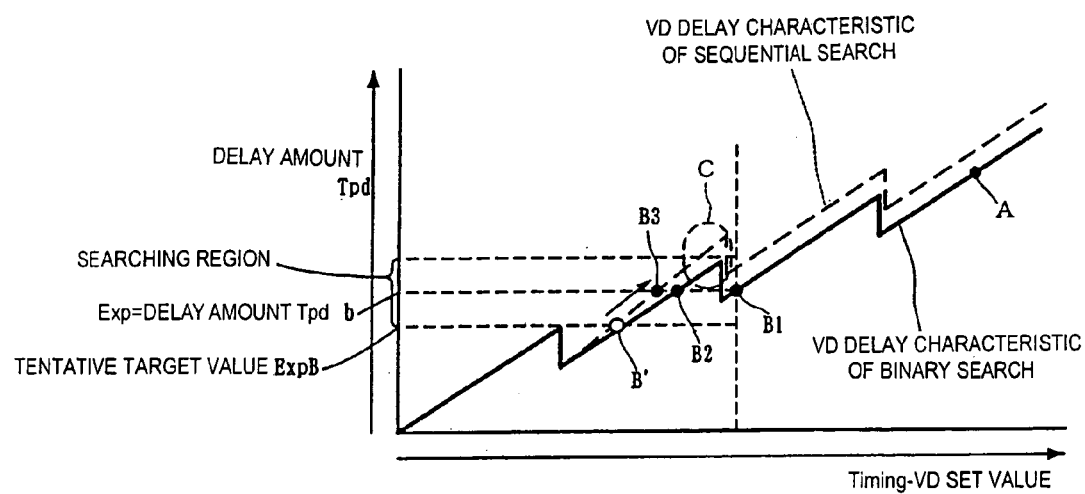
FIG. 3 is a graph showing a change of a delay amount Tpd in a variable delay circuit.

In a case where a delay amount Tpd of a test pattern signal has a serrated characteristic as shown in FIG. 3, the result of the binary search is normally sequentially searched for in a flat place like A point in the figure (when sequential search is performed in an upward or downward direction centering on the A point, the target value Exp can be found).

However, when the result of the binary search is in a valley (in the vicinity of a VD set value increasing side in discontinuity of the delay amount Tpd) of serration like B1 point in the figure, the sequential search is correctly executed in the upward direction centering on the B1 point, but a place (range shown by "C" in the figure) larger than the target value Exp is searched in the sequential search in the downward direction, and the searching cannot be normally performed.

That is, in a case where the target value Exp is above (VD set value increasing side) B1 point, the sequential search is successively performed from the B1 point which is a start point in an increasing direction, and therefore the target value Exp can be found. On the other hand, in a case where the target value Exp is below (VD set value decreasing side) the B1 point, the sequential search is performed from the B1 point which is the start point in a slightly decreasing direction. Thereafter, when discontinuity of the delay amount Tpd is reached, the sequential search is started with the delay amount Tpd larger than the target value Exp. The searching range of the sequential search is sometimes ended before the target value is found. This is because the target value Exp is sometimes outside the searching range of the sequential search in a case where VD delay characteristic of the binary search indicates a value slightly different from that of VD delay characteristic of the sequential search.

Then, like B' point of the figure, the target value Exp in executing the binary search is set anew to a value (tentative target value ExpB) reduced by a downward searching region in the next sequential search.

Moreover, the tentative target value ExpB is regarded as a target to perform the binary search. After the end of the search, the target value Exp is returned to an original value, and the only upward direction is searched from the tentative target value ExpB which is the start point by the sequential search.

Here, the "value reduced by the downward searching region in the next sequential search (from the target value Exp)" is set as the tentative target value ExpB for the following reason.

The target value Exp is included in the searching region of the delay amount Tpd, finally limited by the binary search, and this searching region is the searching range by the sequential search. In the binary search, since the sequence having a pure ascending order (or descending order) is originally a searching object, the searching object in the searching range of the sequential search must be a sequence having the pure ascending order (or the descending order). However, the delay amount Tpd of the variable delay circuit, which is the searching object, has a serrated waveform that entirely increases, and therefore the sequence includes a decrease in a part although it entirely has the ascending order. Here, when a decreased waveform portion (discontinuity) is not included in the searching range of the sequential search, the target value Exp can be securely found because the only sequence having the pure ascending order exists in the searching range. However, when the decreased waveform portion (discontinuity) is included in the searching range of the sequential search, the value of the delay amount Tpd searched for twice or more exists in the searching range of the sequential search. On the other hand, a value of the delay amount Tpd also exists, which would have been searched for in the pure ascending-order sequence, but is not searched for because of presence of the discontinuity. When the target value Exp is included in the value of the delay amount Tpd, which is not searched for in this manner, the target value Exp cannot be found even by the sequential search.

To solve the problem, the tentative target value ExpB is set in such a manner that any discontinuity is not included in the searching range of the sequential search.

The tentative target value ExpB is the "value reduced by the downward searching region in the next sequential search (from the target value Exp)". Therefore, in other words, the value is a lower-limit value of the searching region of the delay amount Tpd. The target value Exp is necessarily included in the searching region of the delay amount Tpd. Therefore, when the sequential search is performed in the upward direction from the tentative target value ExpB which is the lower-limit value in the pure ascending-order sequence in the VD delay characteristic within the searching region, the target value Exp can be found.

Additionally, as shown in FIG. 3, the delay amount Tpd has an entirely increasing waveform even in the vicinity of the VD set value increasing side of the B1 point indicating the result of the binary search, which is the discontinuity. Therefore, when the target value Exp is set to the "value reduced . . . in the downward direction", the value is set in a downward distant position as viewed from the discontinuity/Therefore, in a case where the sequential search is performed in the upward direction from the tentative target value ExpB which is the starting point, the target value Exp can be found before approaching the discontinuity.

Therefore, even in a case where the target value Exp is in the vicinity of the valley (discontinuity of the delay amount Tpd) of the serration like the B1 point, the target value Exp can be normally searched for.

Figure 4:
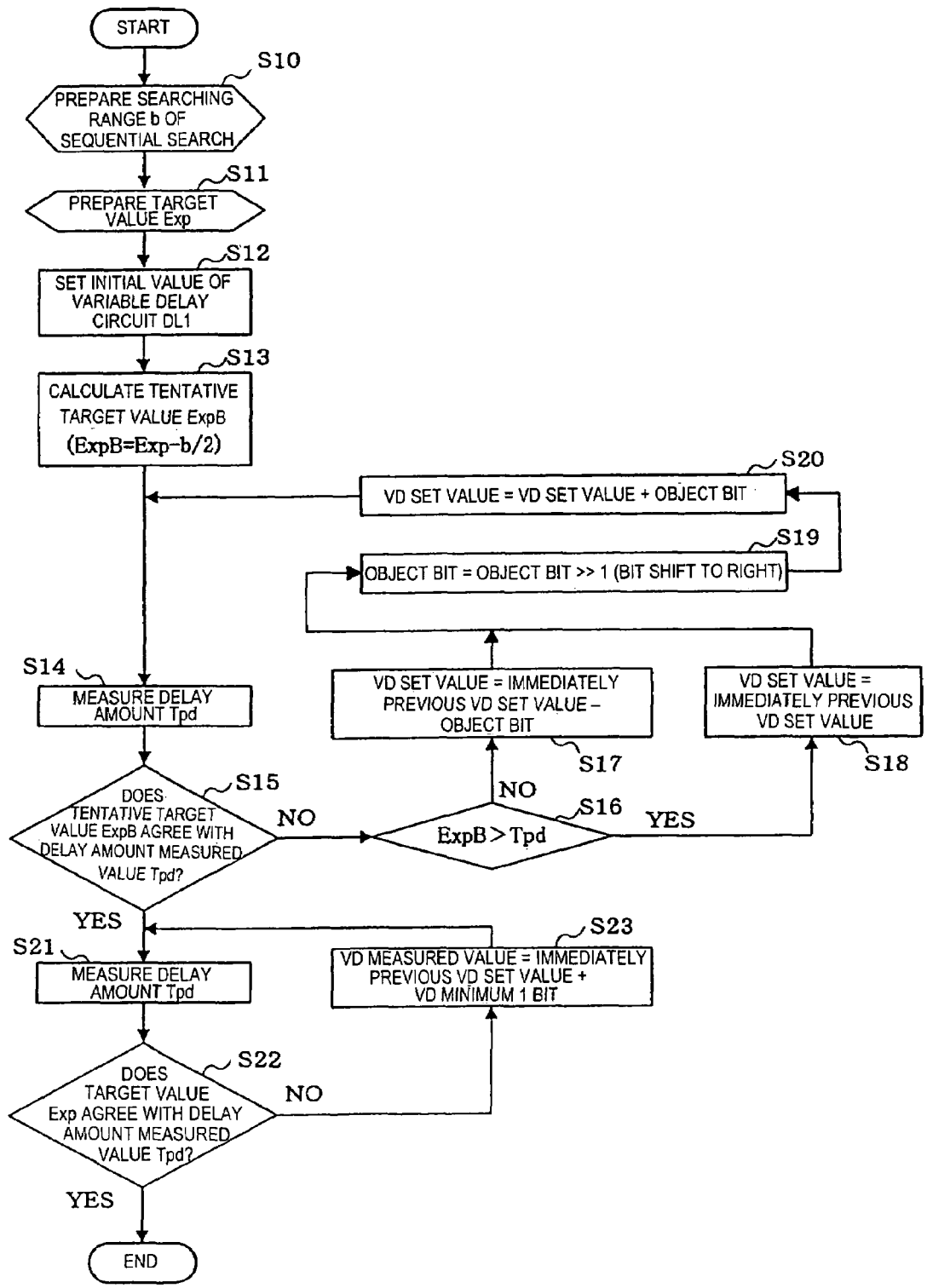
FIG. 4 is a flowchart showing an operation of the search circuit of the present invention.
Figure 5:
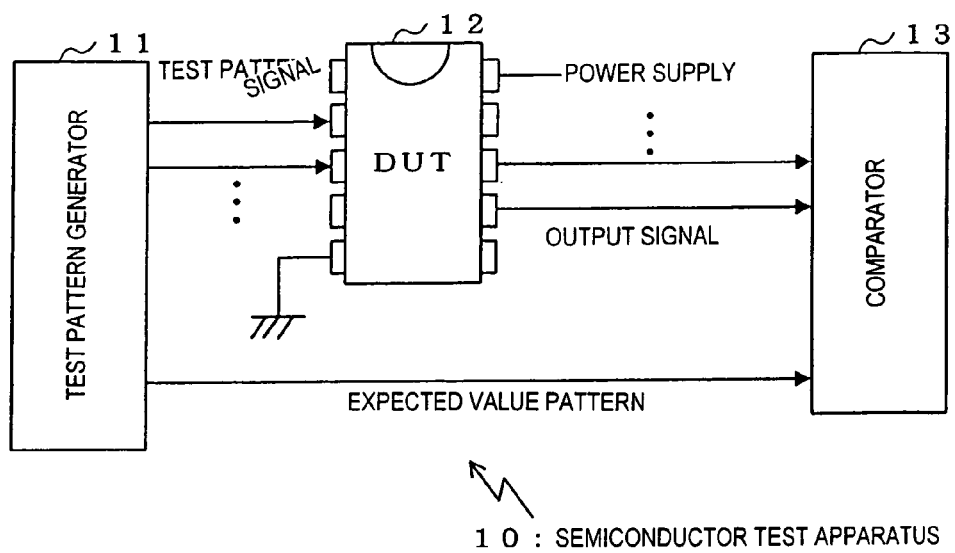
FIG. 5 is a block diagram showing a constitution of a conventional semiconductor test apparatus.
Figure 6:
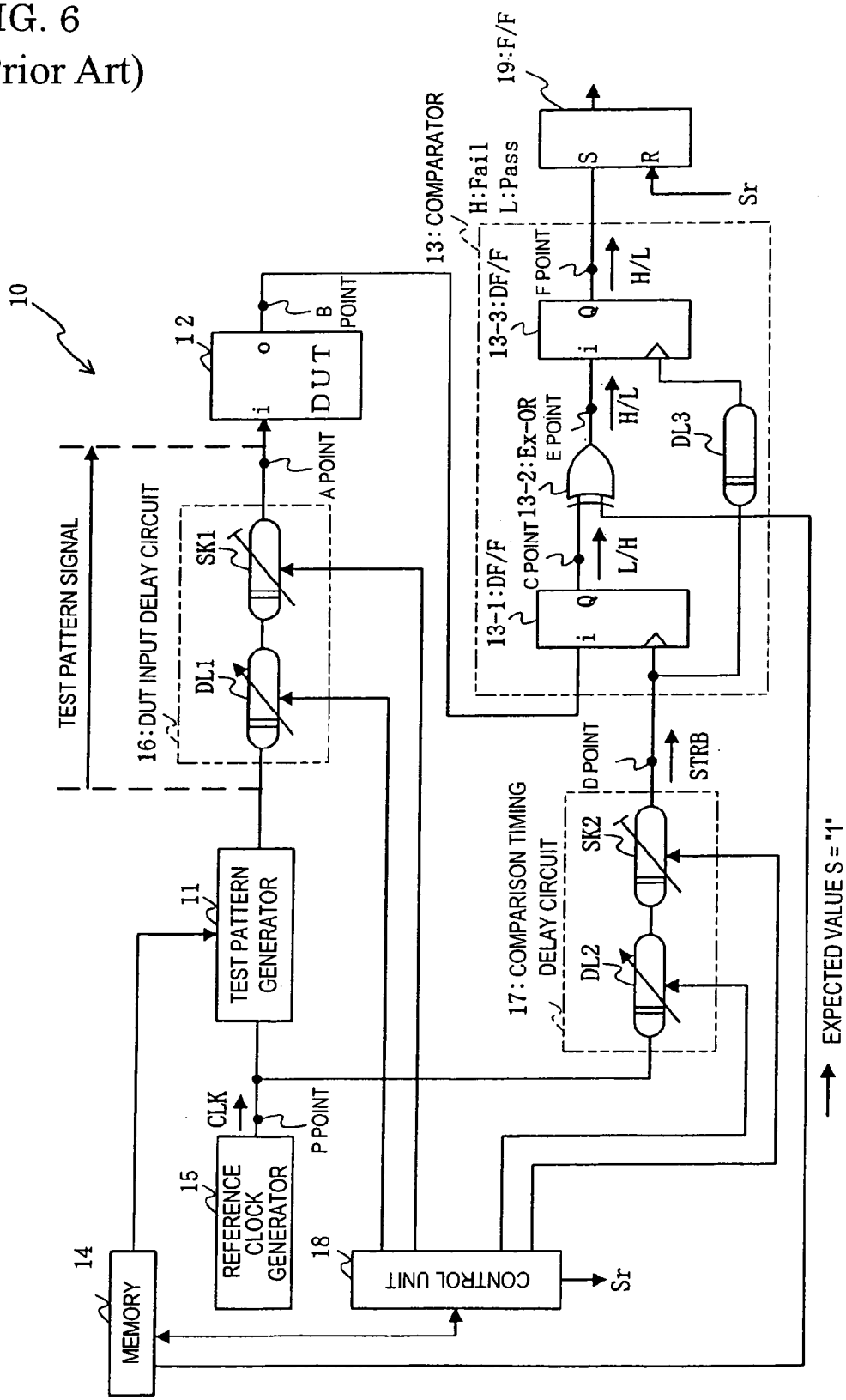
FIG. 6 is a block diagram showing a more specific constitution in the conventional semiconductor test apparatus.
Figure 7:
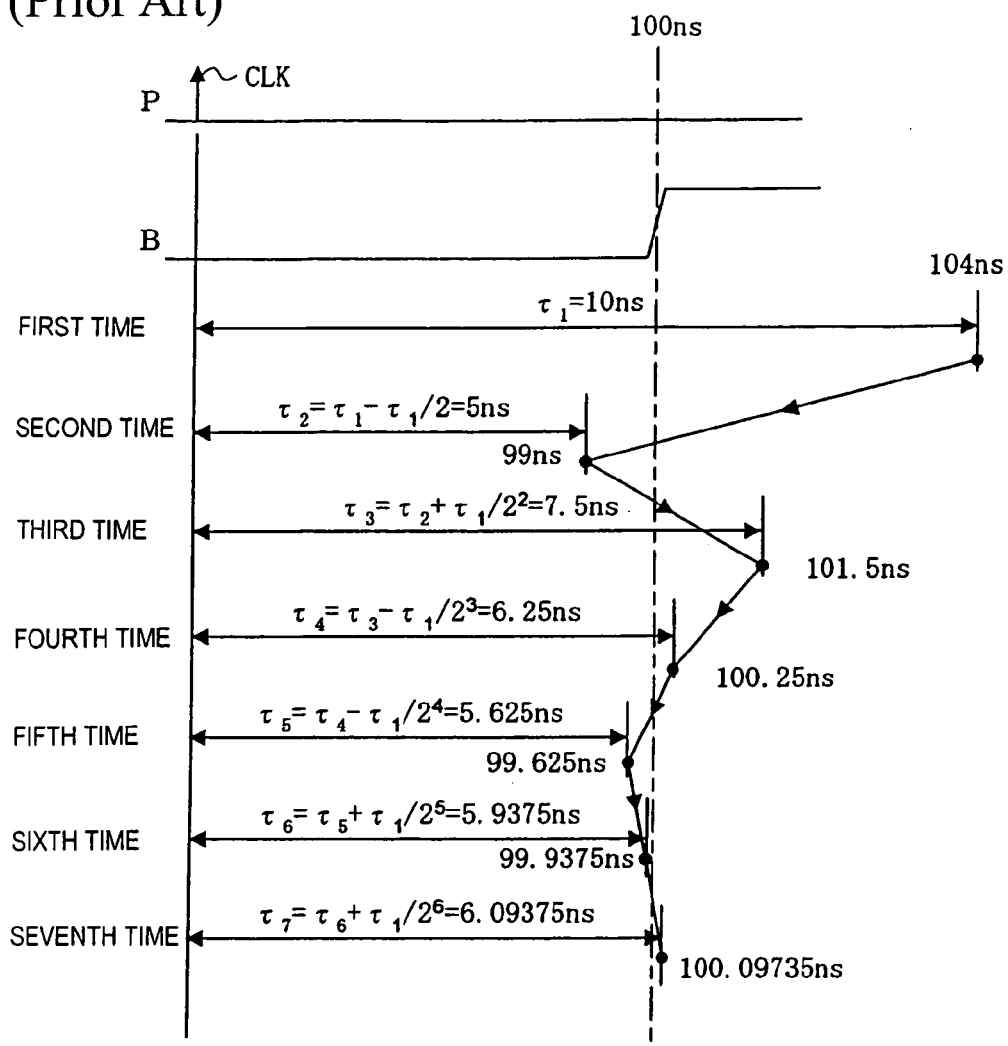
FIG. 7 is a graph showing development of search for a target value by binary search.
Figure 8:
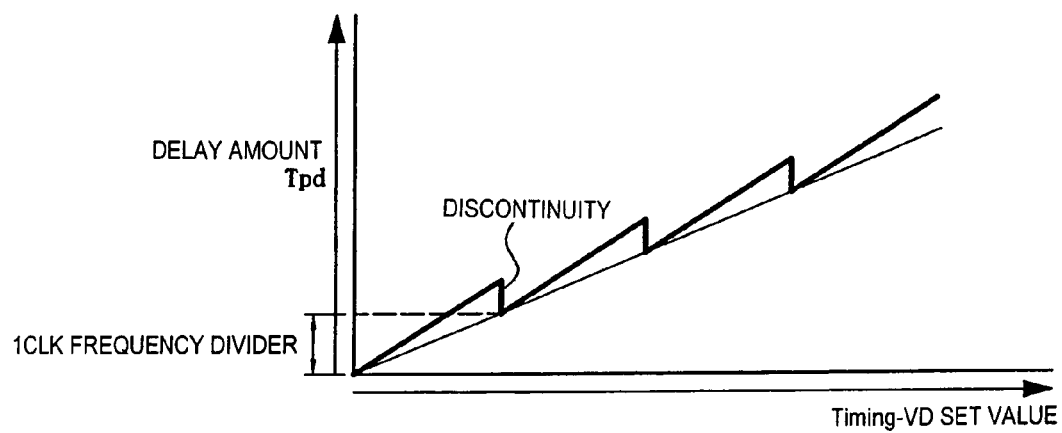
FIG. 8 is a graph showing a change of the delay amount Tpd with respect to a Timing-VD set value in the conventional semiconductor test apparatus.
Figure 9:
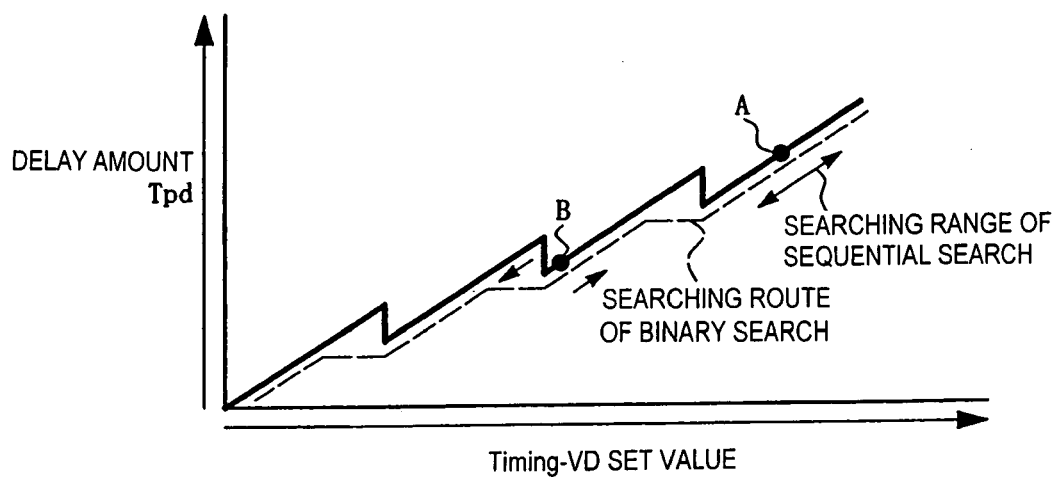
FIG. 9 is a graph showing a searching route of the binary search and a searching range of sequential search in the change of the delay amount Tpd shown in FIG. 8.
Figure 10:
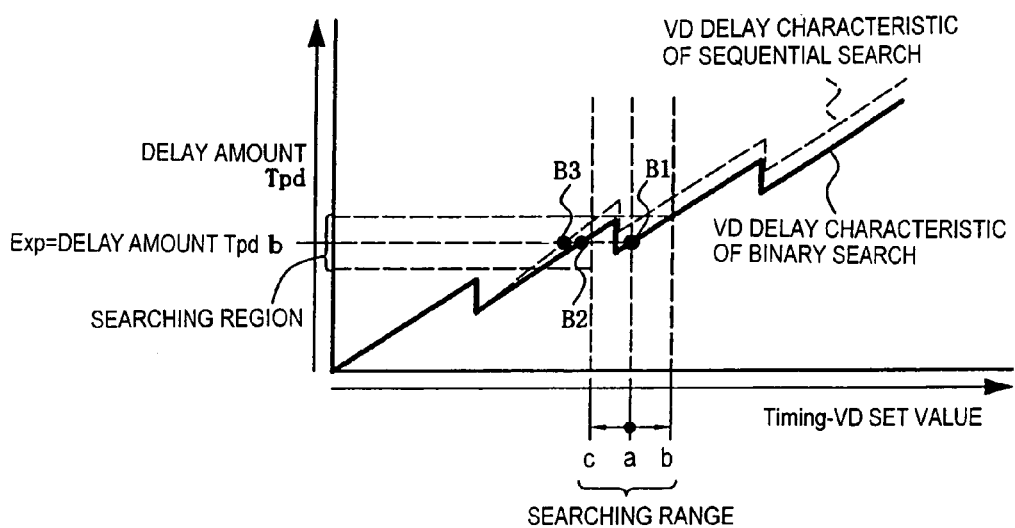
FIG. 10 is a graph showing a VD delay characteristic of the binary search and that of the sequential search in the conventional semiconductor test apparatus.

Next, an operation (searching method) of a semiconductor test apparatus of the present embodiment will be described with reference to FIG. 4.

The figure is a flowchart showing an operation of the search circuit in the semiconductor test apparatus of the present embodiment.

It is to be noted that set value of the variable delay circuit DL1 is based on an assumption of binary digit representation for the sake of convenience of the description. Additionally, the set value of the variable delay circuit DL1 is not limited to the binary digit representation. For example, decimal or octal digit representation may be used.

As shown in the figure, a searching range b of the sequential search (or the searching region b) is stored (prepared) in the storage section 21 (step 10). The searching range b of the sequential search can be obtained as a maximum value of an absolute value of an error, which can be taken, by "|(binary search)−(sequential search)|MAX".

Furthermore, the target value is also stored (prepared) in the storage section 21 (step 11).

Moreover, an initial value (medium value of a VD variable range τ(1 to n)) of the variable delay circuit DL1 is set in the VD setting section 26 (step 12).

Subsequently, in the search control section 27, the target value Exp and the searching range b (of the sequential search) are extracted from the storage section 21, and sent to the tentative target value calculation section 28.

In the tentative target value calculation section 28, a value (target value Exp-searching range b/2) obtained by subtracting or adding the value of the half of the value indicating the searching range b with respect to the target value Exp is calculated as the tentative target value ExpB (step 13). Moreover, the calculated tentative target value ExpB is sent to the search control section 27 from the tentative target value calculation section 28, further sent to the storage section 21, and stored.

Subsequently, in the delay amount measurement section 24, the delay amount Tpd of the test pattern signal is measured based on the test pattern signal from the delay circuit output section 22 (step 14).

Moreover, the delay amount measured value Tpd which is the measurement result is sent to the search control section 27.

On receiving the delay amount measured value Tpd in the search control section 27, the tentative target value ExpB is extracted from the storage section 21, and sent together with the delay amount measured value Tpd to the binary search executing section 25, and execution of the binary search is instructed.

In the binary search executing section 25 instructed to execute the binary search, it is judged whether or not the tentative target value ExpB agrees with the delay amount measured value Tpd (step 15).

As a result of judgment, when the tentative target value ExpB is different from the delay amount measured value Tpd, sizes of the tentative target value ExpB and the delay amount measured value Tpd are subsequently compared/judged (step 16).

As a result of judgment, when the tentative target value ExpB is smaller than the delay amount measured value Tpd, "VD set value (delay amount set value)=immediately previous VD set value−object bit" is executed to calculate the VD set value (step 17).

On the other hand, when the tentative target value ExpB is larger than the delay amount measured value Tpd, "VD set value=immediately previous VD set value" is executed to calculate the VD set value (step 18).

That is, in the binary search executing section 25, "immediately previous VD set value−object bit+bit obtained by shifting object bit by one bit on an LSB side" and "immediately previous VD set value+object bit+object bit by shifting object bit by one bit on the LSB side" are repeated, and the searching is performed to the LSB to obtain a search result.

Furthermore, these calculated VD set values are sent to the search control section 27 from the binary search executing section 25.

In the search control section 27, the received VD set value is sent to the VD setting section 26.

In the VD setting section 26, the variable delay circuit DL1 in the DUT input delay circuit 16 is set based on the received VD set value.

After the setting of the variable delay circuit DL1, in the delay amount measurement section 24, the delay amount Tpd of the test pattern signal is measured again, and sent to the search control section 27 (step 14). Moreover, in the search control section 27, the tentative target value ExpB and the delay amount measured value Tpd are sent to the binary search executing section 25, and compared/judged (step 15), the VD set value is calculated (steps 16 to 18), and the variable delay circuit DL1 is set in the VD setting section 26.

This setting operation of the variable delay circuit DL1 based on the binary search is repeatedly performed until the tentative target value ExpB agrees with the delay amount measured value Tpd (steps 14 to 18).

Thereafter, when it is judged in the binary search executing section 25 that the tentative target value ExpB agrees with the delay amount measured value Tpd (step 15), a search end signal is sent to the search control section 27 from the binary search executing section 25.

In the search control section 27 which has received this search end signal, the delay amount measurement section 24 is instructed to measure the delay amount Tpd of the test pattern signal.

In the delay amount measurement section 24, the delay amount Tpd of the test pattern signal is measured based on the test pattern signal from the delay circuit output section I/F 22 (step 19), and the measured delay amount Tpd (delay amount measured value Tpd) is sent to the search control section 27.

In the search control section 27, the delay amount measured value Tpd from the delay amount measurement section 24, the target value Exp extracted from the storage section 21, and the delay amount set value finally obtained in the binary search executing section 25 are sent to the sequential search executing section 29, and execution of the sequential search is instructed.

In the sequential search executing section 29 which has received the execution instruction, it is judged whether or not the target value Exp agrees with the delay amount measured value Tpd (step 20).

As a result of judgment, when the target value Exp is different from the delay amount measured value Tpd, the VD set value in the next sequential search is calculated (step 21). This VD set value can be calculated by "immediately previous VD set value+VD minimum 1 bit".

Moreover, the calculated VD set value is sent to the VD setting section 26 via the search control section 27, and the variable delay circuit DL1 of the DUT input delay circuit 16 is set based on this VD set value.

After setting the variable delay circuit DL1, in the delay amount measurement section 24, the delay amount Tpd of the test pattern signal is measured again, and sent to the search control section 27 (step 19). Moreover, in the search control section 27, the target value Exp and the delay amount measured value Tpd are sent to the sequential search executing section 29, and compared/judged (step 20), the VD set value is calculated (step 21), and the variable delay circuit DL1 is set in the VD setting section 26.

This setting operation of the variable delay circuit DL1 based on the sequential search is repeatedly performed until the target value Exp agrees with the delay amount measured value Tpd (steps 19 to 21).

Moreover, when the target value Exp agrees with the delay amount measured value Tpd, the searching of the target value Exp ends.

It is to be noted that the search circuit and the searching method of the present invention is not limited to the use for measuring•adjusting the delay amount Tpd of the variable delay circuit DL1 in the DUT input delay circuit of the semiconductor test apparatus. For example, they may be used in a case where the target value Exp in the sequence including a decrease in a part and having an ascending order is searched for using both the binary search and the sequential search.

For example, they are usable in setting (setting the delay amount of DL2 based on comparison/judgment of a response output signal and an expected value pattern) a variable delay circuit DL2 of a comparison timing delay circuit 17 in a comparator 13, adjusting an output timing of a reference clock signal CLK (timing signal) in a reference clock generator 15 (timing signal generation circuit) or the like.

As described above, according to the present invention, the sequence (e.g., the delay amount Tpd of the test pattern signal) which is the searching object indicates an ascending-order sequence (e.g., serrated waveform, etc.) including a decrease in a part. Even in a case where a difference is made between a binary search characteristic and a sequential search characteristic, the target value can be securely and normally searched for.

Furthermore, since the binary search is combined with the sequential search to search for the target value, both the prevention of the drop of the measurement precision and the reduction of the searching time can be achieved consistently.

INDUSTRIAL APPLICABILITY

A search circuit for a target value, a method of searching a target value, and a semiconductor test apparatus using this method according to the present invention is usable in an apparatus or method for searching for a target value in an ascending-order or descending-order sequence including a decrease in a part, which is a searching object.

The invention claimed is:

1. A search circuit for a target value, comprising:
a target value storage section which stores a target value;
a search control section which extracts the target value from the target value storage section and which sets, as a tentative target value, a value obtained by subtracting a predetermined value from the extracted target value or adding the predetermined value thereto;
a binary search executing section which limits a searching range to a certain region including the tentative target value by binary search; and
a sequential search executing section which searches for the target value in an increasing or decreasing direction from the tentative target value which is a start point in the limited searching range by sequential search.

2. A method of searching for a target value, comprising:

a step of storing a target value;

a step of extracting the target value, and setting, as a tentative target value, a value obtained by subtracting a predetermined value from the extracted target value or adding the predetermined value thereto;

a step of limiting a searching range to a certain region including the tentative target value by binary search; and a step of searching for the target value in an increasing or decreasing direction from the tentative target value which is a start point in the limited searching range by sequential search.

3. A semiconductor test apparatus comprising:

a reference clock generation unit which generates a reference clock signal;

a test pattern generation unit which outputs a test pattern signal applied to a semiconductor device in synchronization with the reference clock signal;

a timing generation unit comprising a variable delay circuit which delays the test pattern signal by a predetermined time;

a comparison unit which compares a response output signal output from the semiconductor device with an expected value pattern; and a search circuit comprising:

a storage section which stores a target value;

a delay amount measurement section which obtains a delay amount measured value of the test pattern signal;

a tentative target value calculation section which extracts the target value from the storage section and which calculates, as a tentative target value, a value obtained by subtracting a predetermined value from the extracted target value or adding the predetermined value thereto;

a binary search executing section which applies a delay amount set value of the variable delay circuit in such a manner as to limit a searching range to a certain region including the tentative target value by binary search;

a sequential search executing section which applies the delay amount set value of the variable delay circuit in such a manner as to search for the target value in an increasing or decreasing direction from the tentative target value which is a start point in the limited searching range by sequential search;

a VD setting section which sets a delay amount of the variable delay circuit; and a search control section which sends the tentative target value and the delay amount measured value to the binary search executing section and which sends the delay amount set value from the binary search executing section to the VD setting section to set the delay amount of the variable delay circuit and which sends the delay amount set value, the target value, and the delay amount measured value, obtained by limiting, to the sequential search executing section, when the searching range is limited to the certain region including the tentative target value and which sends the delay amount set value from the sequential search executing section to the VD setting section to set the delay amount of the variable delay circuit.

4. The semiconductor test apparatus according to claim 3, wherein the tentative target value calculation section subtracts or adds a value indicating a region of half of the searching region of the sequential search, which is the predetermined value, with respect to the target value, and calculates the subtracted or added value as the tentative target value.

* * * * *